United States Patent
Hatakeyama et al.

(10) Patent No.: US 6,855,477 B2
(45) Date of Patent: Feb. 15, 2005

(54) CHEMICALLY AMPLIFIED RESIST COMPOSITIONS AND PATTERNING PROCESS

(75) Inventors: Jun Hatakeyama, Niigata-ken (JP); Yuji Harada, Niigata-ken (JP); Yoshio Kawai, Niigata-ken (JP); Masaru Sasago, Hirakata (JP); Masayuki Endo, Izumi (JP); Shinji Kishimura, Itami (JP); Michitaka Ootani, Kawagoe (JP); Haruhiko Komoriya, Kawagoe (JP); Kazuhiko Maeda, Tokyo (JP)

(73) Assignees: Shin-Etsu Chemical Co., Ltd., Tokyo (JP); Matsushita Electric Industrial Co., Ltd., Kadoma (JP); Central Glass Co., Ltd., Ube (JP)

( * ) Notice: Subject to any disclaimer, the term of this patent is extended or adjusted under 35 U.S.C. 154(b) by 187 days.

(21) Appl. No.: 10/256,141

(22) Filed: Sep. 27, 2002

(65) Prior Publication Data
US 2003/0099901 A1 May 29, 2003

(30) Foreign Application Priority Data
Sep. 27, 2001 (JP) ........................................ 2001-296871

(51) Int. Cl.[7] .............................................. G03F 7/004
(52) U.S. Cl. ..................... 430/270.1; 430/325; 430/326
(58) Field of Search ............................ 430/270.1, 325, 430/326

(56) References Cited

U.S. PATENT DOCUMENTS

| | | | |
|---|---|---|---|
| 4,491,628 A | 1/1985 | Ito et al. |
| 5,310,619 A | 5/1994 | Crivello et al. |

| | | | |
|---|---|---|---|
| 2003/0036016 A1 * | 2/2003 | Szmanda et al. ........ 430/270.1 |

FOREIGN PATENT DOCUMENTS

| | | |
|---|---|---|
| EP | 0 794 458 A2 | 9/1997 |
| JP | 63-27829 A | 2/1988 |
| JP | 2-27660 B2 | 6/1990 |
| JP | 9-73173 A | 3/1997 |
| JP | 9-230595 A | 9/1997 |
| JP | 10-10739 A | 1/1998 |
| WO | WO 97/33198 | 9/1997 |

OTHER PUBLICATIONS

Hamad, A.H. et al., Fluorinated dissolution inhibitors for 157 nm lithography, Mar. 2002, SPIE, vol. 4690, 477–485.*

* cited by examiner

Primary Examiner—Rosemary Ashton
(74) Attorney, Agent, or Firm—Birch, Stewart, Kolasch & Birch, LLP

(57) ABSTRACT

A chemically amplified resist composition comprising (A) a polymer comprising recurring units containing at least one fluorine atom, (B) a compound of formula (1) wherein $R^1$ and $R^2$ are H, F or alkyl or fluorinated alkyl, at least one of $R^1$ and $R^2$ contains at least one fluorine atom, $R^3$ is a single bond or alkylene, $R^4$ is a n-valent aromatic or cyclic diene group, $R^5$ is H or $C(=O)R^6$, $R^6$ is H or methyl, and n is 2, 3 or 4, (C) an organic solvent, and (D) a photoacid generator is sensitive to high-energy radiation and has improved sensitivity and transparency at a wavelength of less than 200 nm.

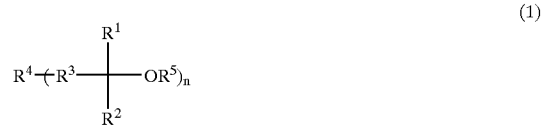

(1)

5 Claims, 1 Drawing Sheet

CHEMICALLY AMPLIFIED RESIST COMPOSITIONS AND PATTERNING PROCESS

This invention relates to chemically amplified resist compositions, especially chemically amplified positive resist compositions, suited for microfabrication, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF laser (248 nm) brought about a significant innovation. Even mass fabrication of 0.18-μm rule devices becomes possible. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Resist materials adapted for KrF excimer lasers enjoyed early use on the 0.3 micron process, passed through the 0.25 micron rule, and currently entered the mass production phase on the 0.18 micron rule. Engineers have started investigation on the 0.15 micron rule, with the trend toward a finer pattern rule being accelerated. The change-over from KrF to shorter wavelength ArF excimer laser (193 nm) is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198. With respect to $F_2$ laser (157 nm) which is expected to enable further miniaturization to 0.10 μm or less, more difficulty arises in insuring transparency because it was found that acrylic resins are not transmissive to light at all and those cycloolefin resins having carbonyl bonds have strong absorption.

With respect to improvements in transmittance, it is reported that polymers having fluorine atoms and siloxane bonds have a relatively high transmittance. Various fluorine and silicon-containing polymers have been studied to develop resist compositions adapted for $F_2$ laser. However, since fluorides and siloxanes are highly water repellent substances, there revealed a problem that such compositions were repellent to developers in the form of alkaline water. Because of a large contact angle with a developer, the developer did not spread over the entire surface of a wafer. Alternatively, because of poor penetration of the developer, development defects generated in that some space portions were not removed. Especially, the introduction of fluorine was effective for increasing transmittance, but was found to reduce developer wettability and dry etching resistance. The reduction of developer wettability is so significant that the resist film is repellent to the developer and prevents the developer from spreading over, or exposed areas are not dissolved, or a substantially insoluble surface layer causes the pattern profile to become T-top.

For resist compositions adapted for KrF and ArF exposure, methods of adding compounds containing water-soluble groups such as phenol, carboxyl, sulfonamide and carbonamide groups were proposed to solve the above problems. Examples include carboxylic anhydrides described in JP-A 2000-47385 and JP-A 2000-275840, phosphine compounds described in JP-A 2000-275838, thiocarbonyl group-containing compounds described in JP-A 2000-275841, carboxyl group-containing compounds described in JP-A 11-339150, and sulfonamide compounds described in JP-A 11-327145. However, all the foregoing substances exhibit strong absorption at 157 nm and thus have the drawback of reducing the transmittance of resist compositions.

There is a need to have an additive which is highly transparent and has good affinity to a developer.

SUMMARY OF THE INVENTION

An object of the invention is to provide a chemically amplified resist composition which is improved in developer wettability and exposed area dissolution, minimized in scum, and improved in T-top profile without reducing the transmittance. Another object is to provide a patterning process using the same.

It has been found that by formulating a compound of the formula (1) shown below in a resist composition based on a fluorinated polymer, developer wettability and exposed area dissolution are improved, scum in exposed areas is minimized, and the pattern profile is prevented from becoming T-top, without reducing the transmittance at 157 nm.

In one aspect, the invention provides a chemically amplified resist composition comprising (A) a polymer comprising recurring units containing at least one fluorine atom, (B) a compound of the general formula (1) shown below, (C) an organic solvent, (D) a photoacid generator, and optionally, (E) a basic compound.

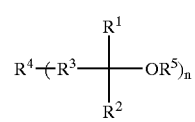

(1)

Herein $R^1$ and $R^2$ are independently hydrogen, fluorine or alkyl or fluorinated alkyl having 1 to 4 carbon atoms, at least either one of $R^1$ and $R^2$ contains at least one fluorine atom, $R^3$ is a single bond or alkylene of 1 to 4 carbon atoms, $R^4$ is a n-valent organic group having 4 to 40 carbon atoms and containing at least one aromatic ring or cyclic diene ring, $R^5$ is hydrogen or $C(=O)R^6$, $R^6$ is hydrogen or methyl, and n is 2, 3 or 4.

In one preferred embodiment, the polymer (A) has recurring units of at least one of the following general formulae (a-1), (b-1), (c-1) and (d-1).

(a-1)

(b-1)

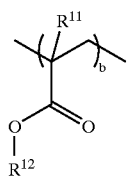

(c-1)

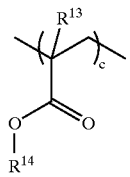

(d-1)

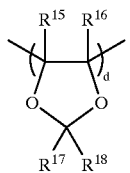

Herein $R^7$, $R^8$, $R^9$ and $R^{10}$ each are hydrogen, fluorine or trifluoromethyl, at least one of $R^7$ to $R^{10}$ contains fluorine, $R^{11}$ is hydrogen, methyl or trifluoromethyl, $R^{12}$ is a straight, branched or cyclic alkyl group of 1 to 20 carbon atoms containing at least one fluorine atom, $R^{13}$ is trifluoromethyl, $R^{14}$ is an acid labile group, $R^{15}$ and $R^{16}$ each are hydrogen or fluorine, $R^{17}$ and $R^{18}$ each are methyl or trifluoromethyl, at least one of $R^{15}$ to $R^{18}$ contains fluorine.

In another aspect, the invention provides a process for forming a resist pattern comprising the steps of applying the resist composition onto a substrate to form a coating; heat treating the coating and then exposing it to high-energy radiation in a wavelength band of 100 to 180 nm through a photo mask; and optionally heat treating the exposed coating and developing it with a developer. The high-energy radiation is often an $F_2$ laser beam or $Ar_2$ laser beam.

DESCRIPTION OF THE PREFERRED EMBODIMENTS

Figure 1:
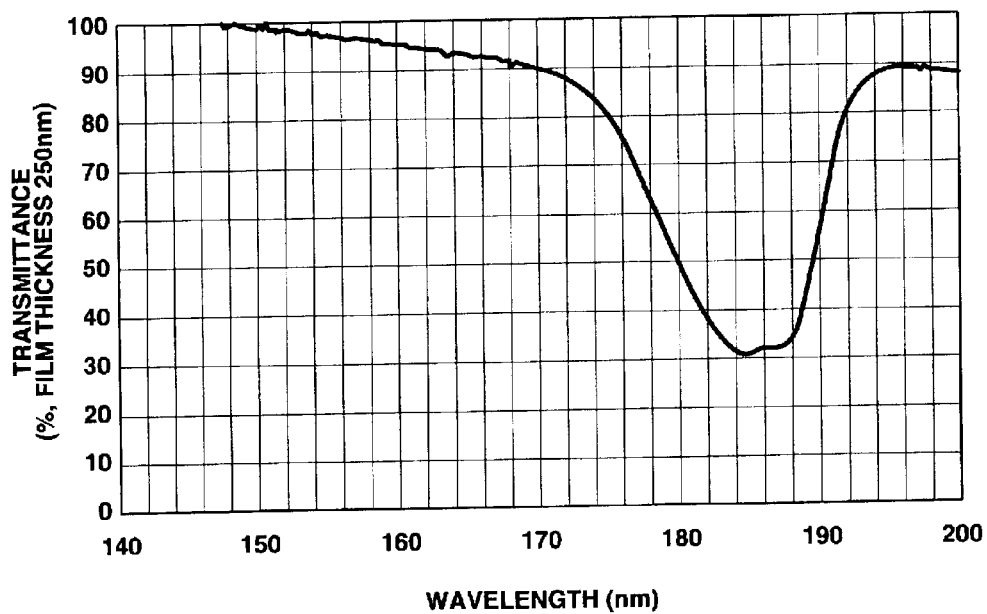
FIG. 1 is a graph showing the measured transmittance of an additive designated DRA-2.

The chemically amplified resist composition of the invention, which is often of the positive working type, is defined as comprising (A) a polymer comprising recurring units containing at least one fluorine atom (also referred to as a base polymer), (B) a compound of the general formula (1), (C) an organic solvent, (D) a photoacid generator, and optionally and preferably (E) a basic compound.

The inventive composition is characterized by the use of a compound of the general formula (1).

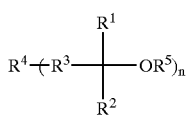

(1)

Herein $R^1$ and $R^2$ are independently hydrogen, fluorine or an alkyl or fluorinated alkyl group having 1 to 4 carbon atoms, at least either one of $R^1$ and $R^2$ contains at least one fluorine atom (i.e., fluorine or fluorinated alkyl group), $R^3$ is a single bond or an alkylene group of 1 to 4 carbon atoms, $R^4$ is a n-valent organic group having 4 to 40 carbon atoms and containing at least one aromatic ring or cyclic diene ring, $R^5$ is hydrogen or C(=O)$R^6$, $R^6$ is hydrogen or methyl, and n is 2, 3 or 4, The aromatic and/or cyclic diene ring-containing organic groups represented by $R^4$ include groups containing an aromatic ring or diene ring as shown below or groups containing two or more of such aromatic rings and diene rings. The diene ring is a ring which does not contain a heteroatom or contains a heteroatom such as S, O or N, and which has two double bonds therein.

Illustrative examples of $R^4$ are di-to tetravalent groups derived from the ring-bearing compounds shown below, by eliminating two to four of the hydrogen atoms attached to ring-forming carbon atoms.

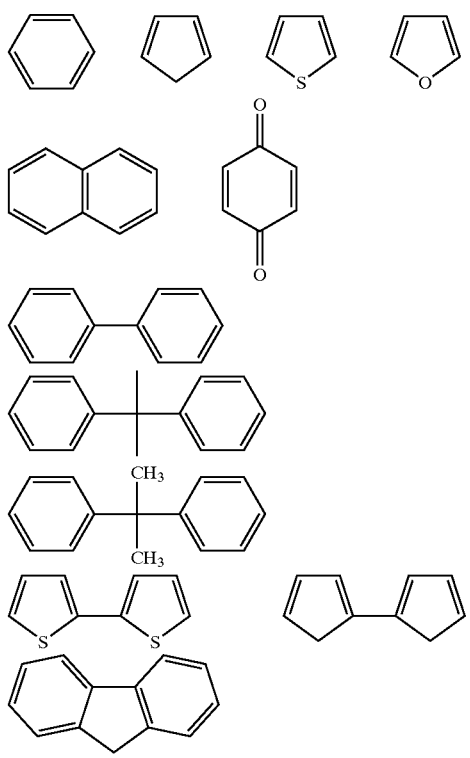

-continued

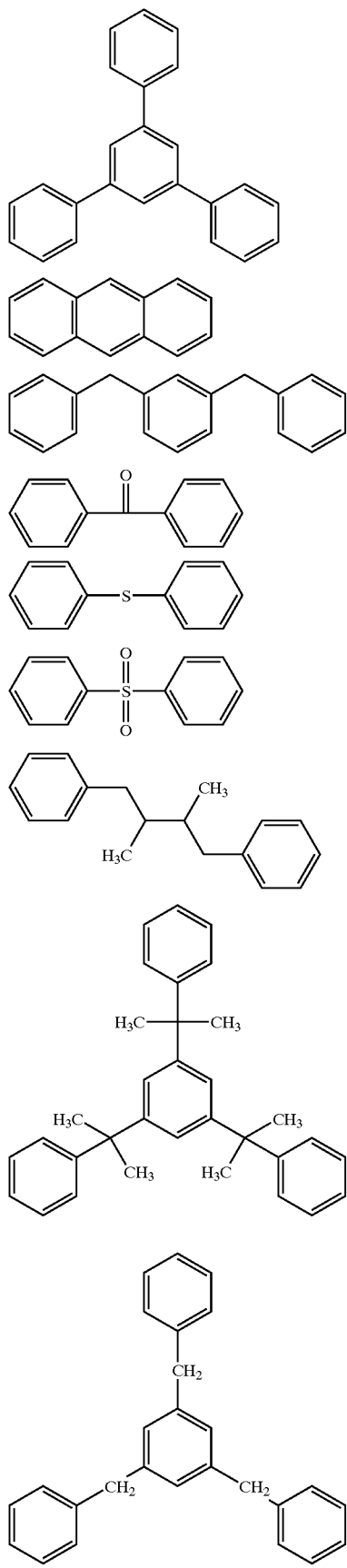

-continued

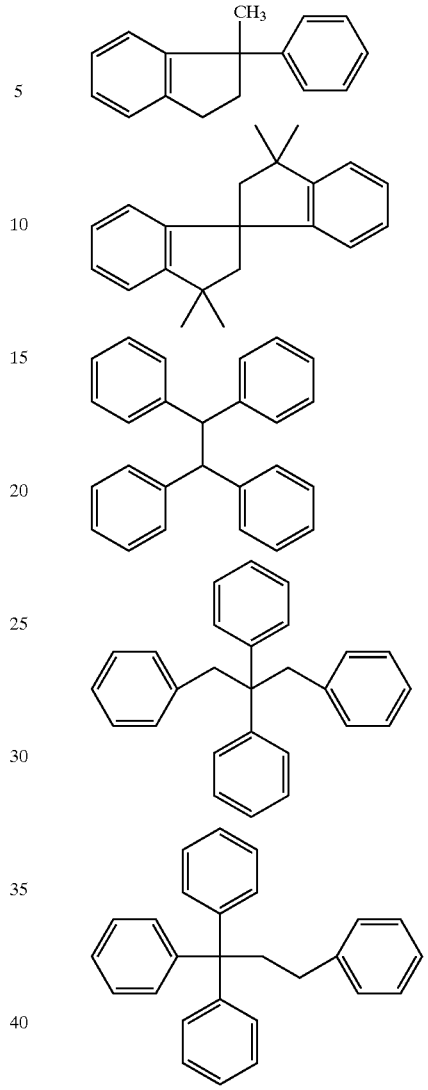

With respect to $R^4$, monocyclic or bridged ring alkyl groups are ineffective for improving dry etch resistance, whereas compounds containing an aromatic ring and/or diene ring as described above are preferred. While an aryl group containing double bonds are generally believed to have high absorption at 157 nm, the absorption can be significantly reduced by attaching a hexafluoroalcohol group as a pendant. In particular, benzene having two hexafluoroalcohol groups substituted thereon has been found to exhibit no absorption at 157 nm. Hexafluoroalcohol is believed to have an acidity approximately equal to that of a phenolic hydroxyl group, and have both appropriate alkali solubility and hydrophilicity. While it was proposed to add a phenol compound or carboxyl group-containing compound to a resist composition adapted for 248 nm exposure to suppress T-top profiling, the addition of a compound having hexafluoroalcohol as a dissolvable group is desirable for 157 nm exposure. The hydrogen atom of the hydroxyl group of hexafluoroalcohol can be substituted with another adhesive group such as an alkylcarbonyl group.

Various methods may be used for the synthesis of the compound of formula (1). Illustratively, the compound having hexafluoroalcohol as a pendant is generally prepared by reacting a compound wherein $R^4$ is halo-substituted with hexafluoroacetone or the like, or by reacting a compound wherein R⁴ is not halo-substituted with hexafluoroacetone or the like in the presence of a Lewis acid.
Illustrative examples of the compounds of formula (1) include those of formulae (1)-1 through (1)-44 below.
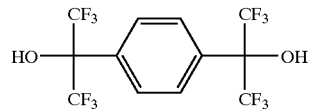
(1)-1
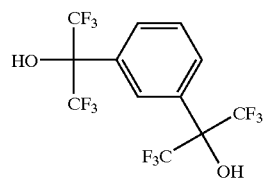
(1)-2
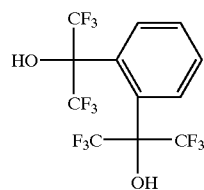
(1)-3
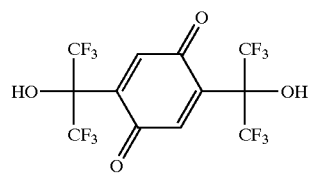
(1)-4
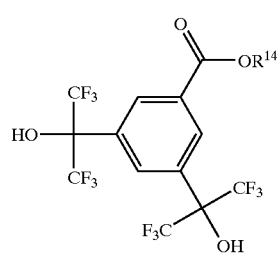
(1)-5
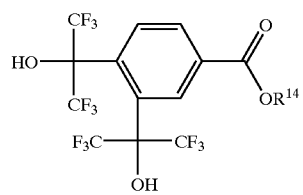
(1)-6
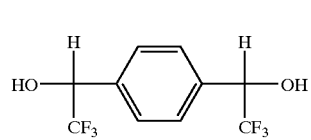
(1)-7
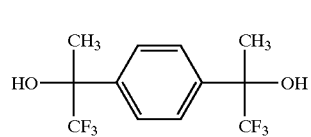
(1)-8
-continued
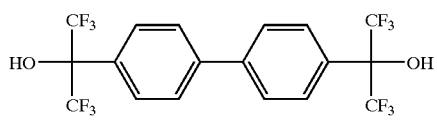
(1)-9
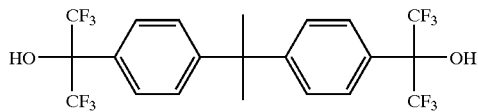
(1)-10
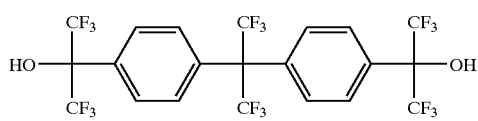
(1)-11
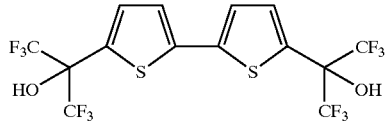
(1)-12
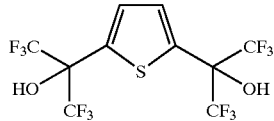
(1)-13
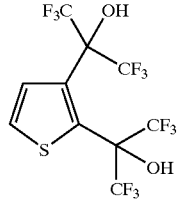
(1)-14
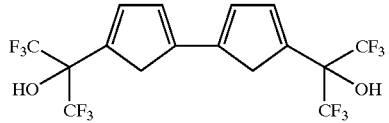
(1)-15
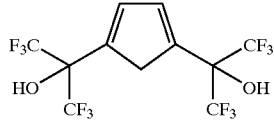
(1)-16
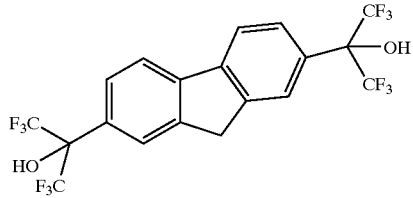
(1)-17

-continued
(1)-18
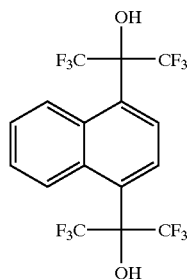
(1)-19
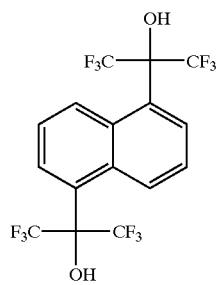
(1)-20
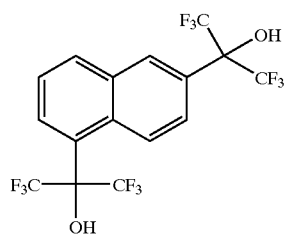
(1)-21
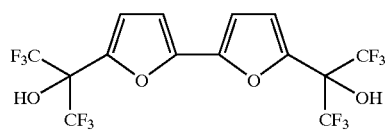
(1)-22
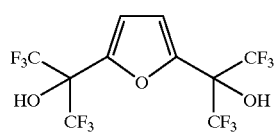
(1)-23
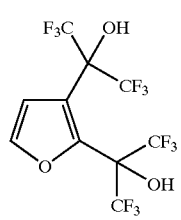
(1)-24
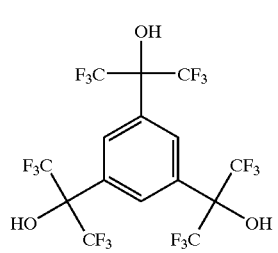
-continued
(1)-25
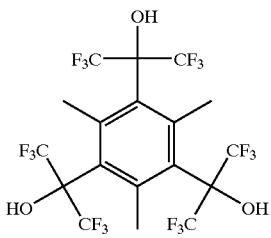
(1)-26
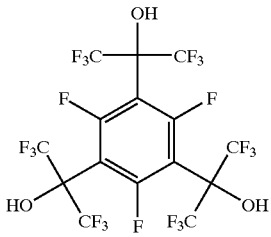
(1)-27
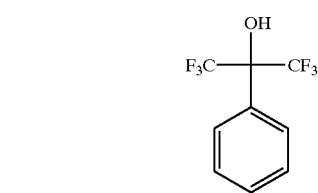
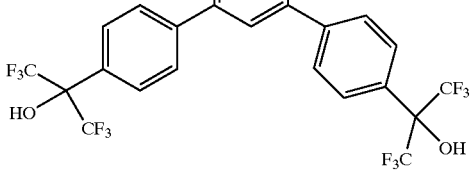
(1)-28
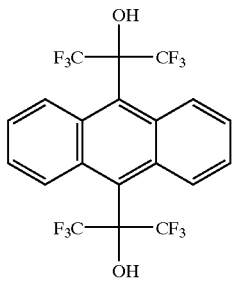
(1)-29
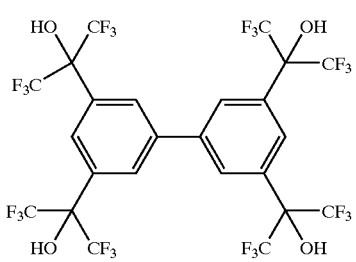

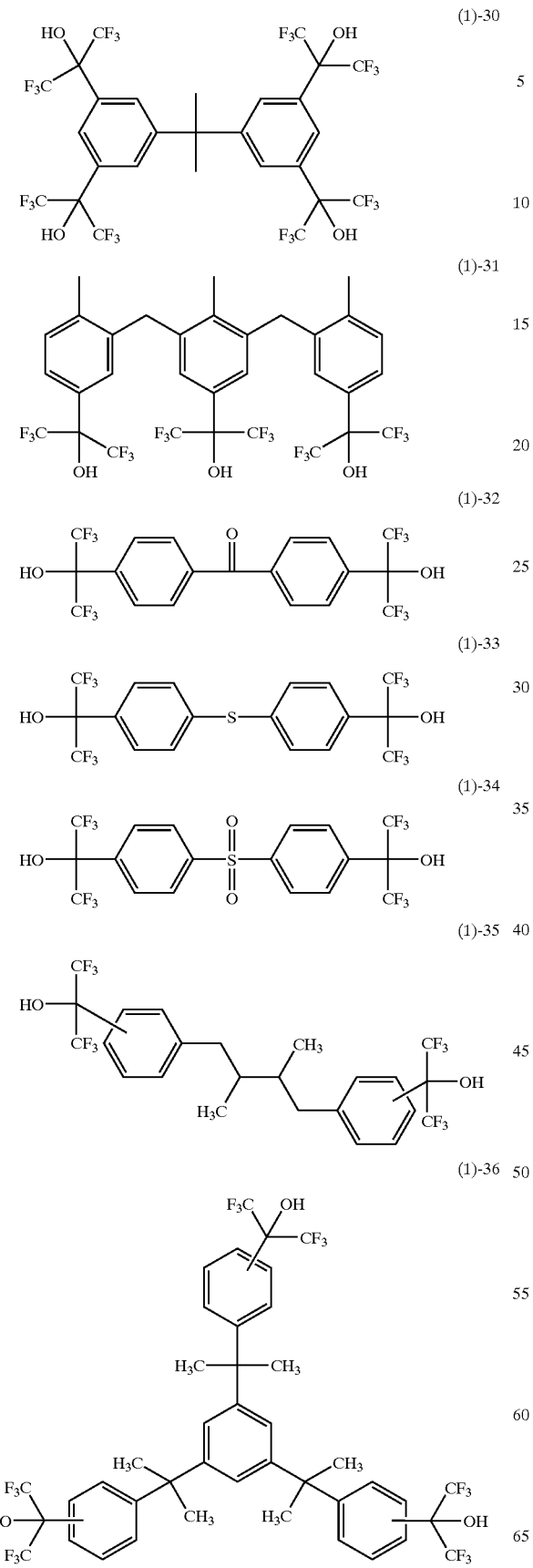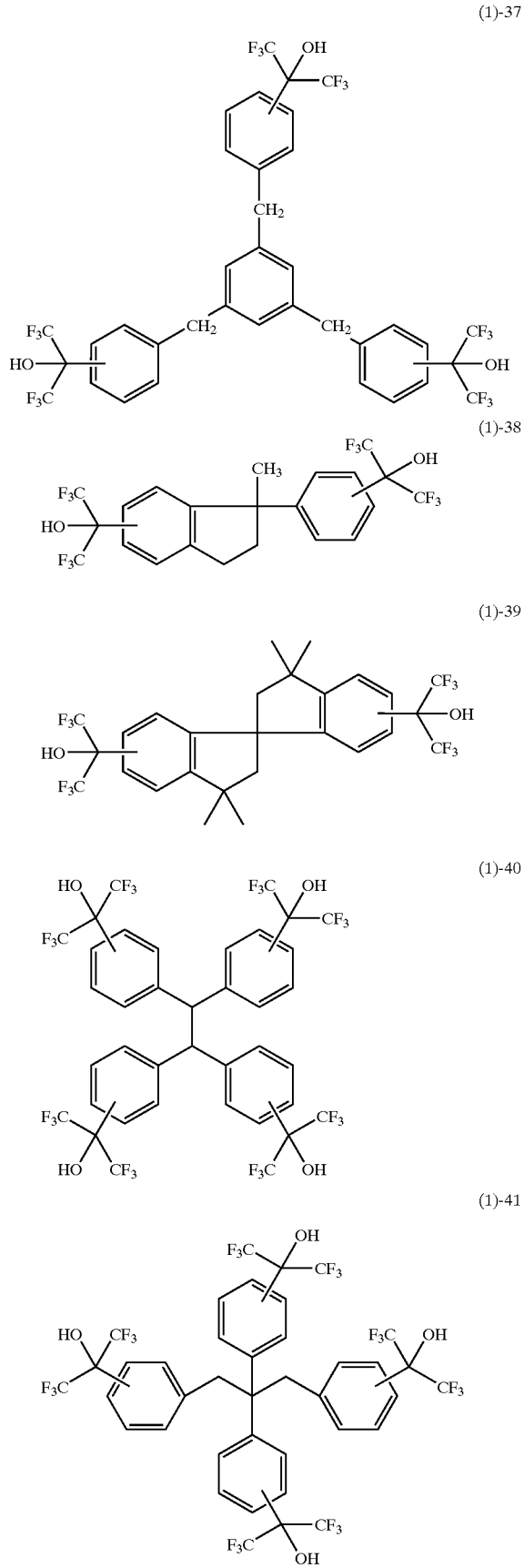

-continued

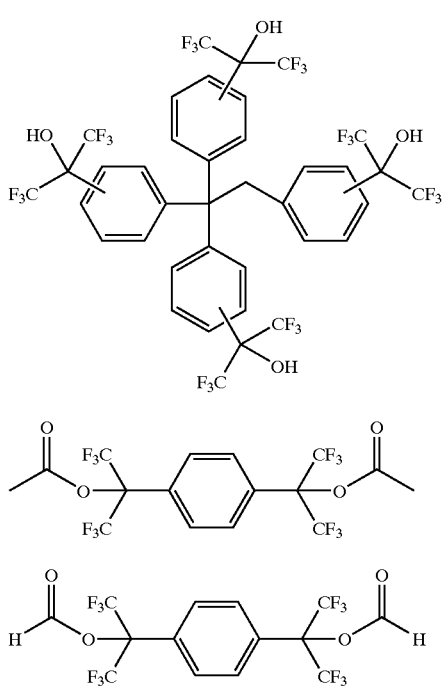
(1)-42

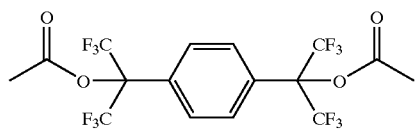
(1)-43

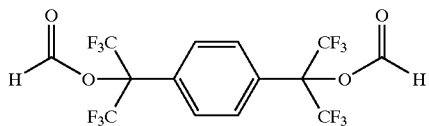
(1)-44

In the practice of the invention, the compound of formula (1), when added to the base polymer (A) containing at least one fluorine atom, plays the role of improving the solubility in alkaline solution of the base polymer and the adhesion thereof to the substrate. In this regard, the compound of formula (1) is also referred to as dissolution accelerator. An appropriate amount of the compound of formula (1) added is 1 to 40 parts, preferably 2 to 30 parts by weight per 100 parts by weight of the base polymer (A). Less than 1 part of the compound (B) may fail to achieve the desired effects whereas more than 40 parts of the compound (B) may cause film softening, allowing the distance of acid diffusion during PEB to extraordinarily increase and also cause film slimming, incurring a rounding of the pattern top.

The addition of the compound of formula (1) is effective especially when the base polymer is significantly repellent to the developer. The base polymer (A) must contain at least one fluorine atom. Desirably the base polymer has recurring units of at least one of the following general formulae (a-1), (b-1), (c-1) and (d-1). The recurring units of formulae (a-1), (b-1), (c-1) and (d-1) are highly effective for improving transmittance, but outstandingly repellent to the developer.

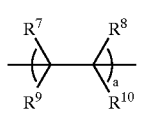
(a-1)

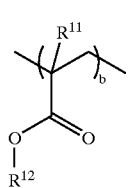
(b-1)

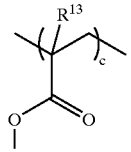
(c-1)

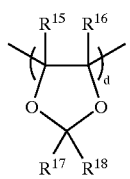
(d-1)

Herein $R^7$, $R^8$, $R^9$ and $R^{10}$ each are hydrogen, a fluorine atom or trifluoromethyl group, at least one of $R^7$ to $R^{10}$ contains a fluorine atom or atoms (i.e., fluorine atom or trifluoromethyl group), $R^{11}$ is hydrogen, a methyl or trifluoromethyl group, $R^{12}$ is a straight, branched or cyclic alkyl group of 1 to 31 carbon atoms containing at least one fluorine atom, $R^{13}$ is a trifluoromethyl group, $R^{14}$ is an acid labile group, $R^{15}$ and $R^{16}$ each are hydrogen or a fluorine atom, $R^{17}$ and $R^{18}$ each are a methyl or trifluoromethyl group, at least one of $R^{15}$ to $R^{18}$ contains a fluorine atom or atoms.

Examples of $R^{12}$ include those of the following formulae (2)-1 to (2)-17.

(2)-1

(2)-2

(2)-3

(2)-4

(2)-5

(2)-6

(2)-7

(2)-8

(2)-9

(2)-10

(2)-11

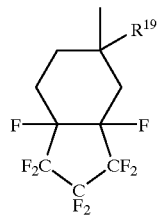 (2)-12

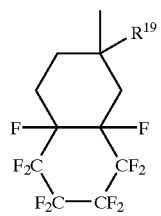 (2)-13

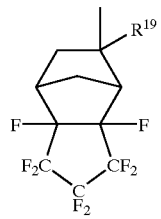 (2)-14

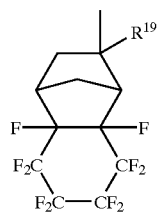 (2)-15

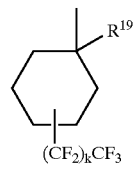 (2)-16

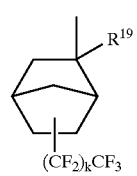 (2)-17

Herein $R^{19}$ is hydrogen, fluorine or a straight, branched or cyclic alkyl or fluorinated alkyl group of 1 to 20 carbon atoms, and k is an integer from 0 to 10.

The base polymer (A) is made insoluble or substantially insoluble in alkaline solution by substituting the hydrogen atom of a hydroxyl group of phenol or carboxyl group with an acid labile group. Recurring units containing acid labile groups are (c-1) units, while the base polymer may further contain units of the following formulae (3)-1 to (3)-8.

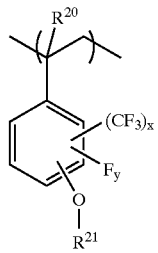 (3)-1

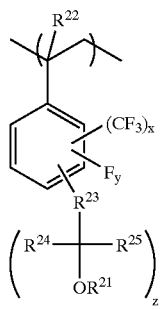 (3)-2

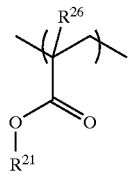 (3)-3

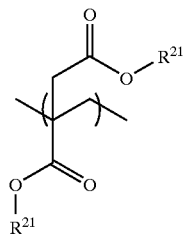 (3)-4

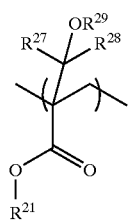 (3)-5

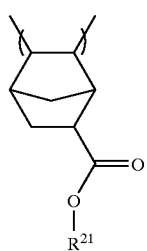 (3)-6

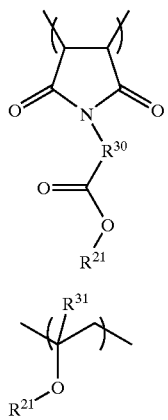
(3)-7

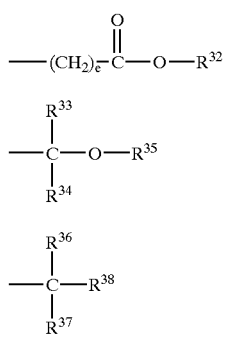
(3)-8

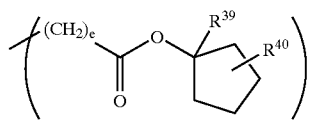
(AL10)-1

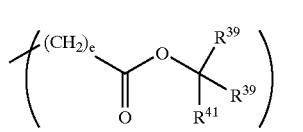
(AL10)-2

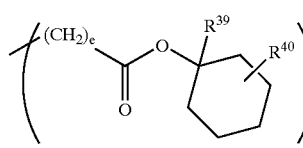
(AL10)-3

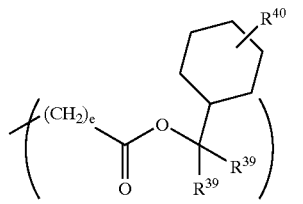
(AL10)-4

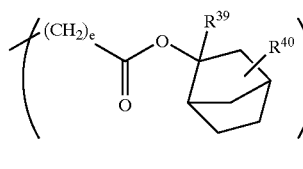
(AL10)-5

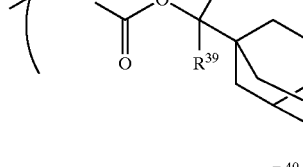
(AL10)-6

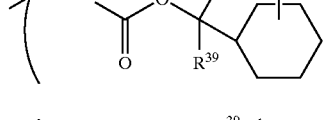
(AL10)-7

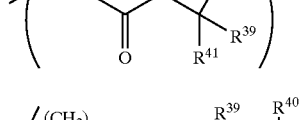
(AL10)-8

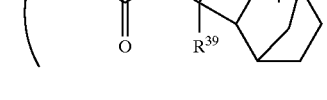
(AL10)-9

Herein $R^{21}$ is an acid labile group, $R^{20}$, $R^{22}$, $R^{26}$ and $R^{31}$ each are hydrogen, methyl or trifluoromethyl, $R^{23}$ and $R^{30}$ each are a single bond or $C_{1-4}$ alkylene, $R^{24}$ and $R^{25}$, or $R^{27}$ and $R^{28}$, which may be the same or different, are hydrogen, fluorine or $C_{1-4}$ alkyl or fluorinated $C_{1-4}$ alkyl, either one or both of $R^{24}$ and $R^{25}$, or $R^{27}$ and $R^{28}$ contain at least one fluorine atom, $R^{29}$ is hydrogen, $C_{1-4}$ alkyl, carbonylalkyl or acid labile group, x and y each are an integer of 1 to 4, z is equal to 1 or 2.

In the base polymer, the acid labile groups may be identical or different and selected from a variety of such groups, preferably from groups of formulae (AL10) and (AL11), a $C_{4-40}$ tertiary alkyl group of formula (AL12), a trialkylsilyl group in which each alkyl moiety has 1 to 6 carbon atoms, and an oxoalkyl group of 4 to 20 carbon atoms.

$$—(CH_2)_e—\overset{O}{\overset{\|}{C}}—O—R^{32} \quad (AL10)$$

$$—\overset{R^{33}}{\underset{R^{34}}{\overset{|}{\underset{|}{C}}}}—O—R^{35} \quad (AL11)$$

$$—\overset{R^{36}}{\underset{R^{37}}{\overset{|}{\underset{|}{C}}}}—R^{38} \quad (AL12)$$

In formulae (AL10) and (AL11), $R^{32}$ and $R^{35}$ each are a straight, branched or cyclic alkyl group of 1 to 30 carbon atoms which may contain a heteroatom such as oxygen, sulfur, nitrogen or fluorine and may also contain aryl or aralkyl group having 6 to 20 carbon atoms; $R^{33}$ and $R^{34}$ each are hydrogen or a straight, branched or cyclic alkyl group of 1 to 20 carbon atoms which may contain a heteroatom such as oxygen, sulfur, nitrogen or fluorine; "e" is an integer of 0 to 10; a pair of $R^{33}$ and $R^{34}$, $R^{33}$ and $R^{35}$, and $R^{34}$ and $R^{35}$, taken together, may form a ring. Illustrative examples of the compound of formula (AL10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL10)-1 to (AL10)-9.

In formulae (AL10)-1 to (AL10)-9, $R^{39}$ is independently a straight, branched or cyclic alkyl group of 1 to 8 carbon atoms, an aryl group of 6 to 20 carbon atoms or an aralkyl group; $R^{40}$ is a single bond or a straight, branched or cyclic alkyl group of 1 to 20 carbon atoms; $R^{41}$ is an aryl group of 6 to 20 carbon atoms or aralkyl group; and "e" is as defined above.

Illustrative examples of the acetal group of formula (AL11) include those of the following formulae (AL11)-1 to (AL11)-23.

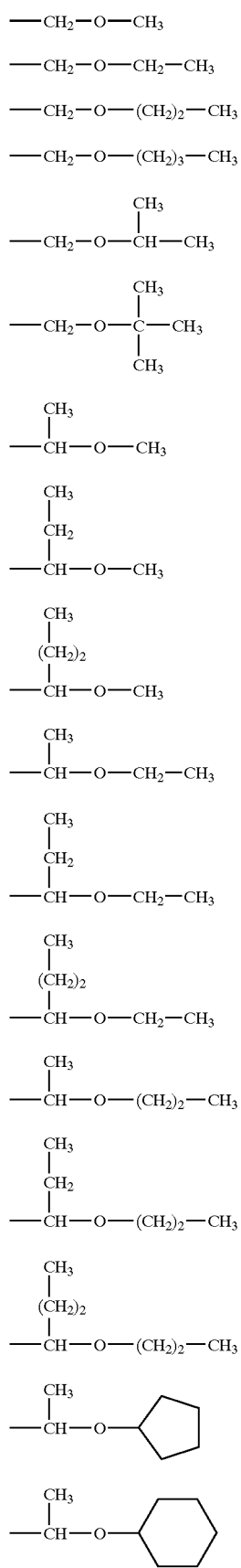

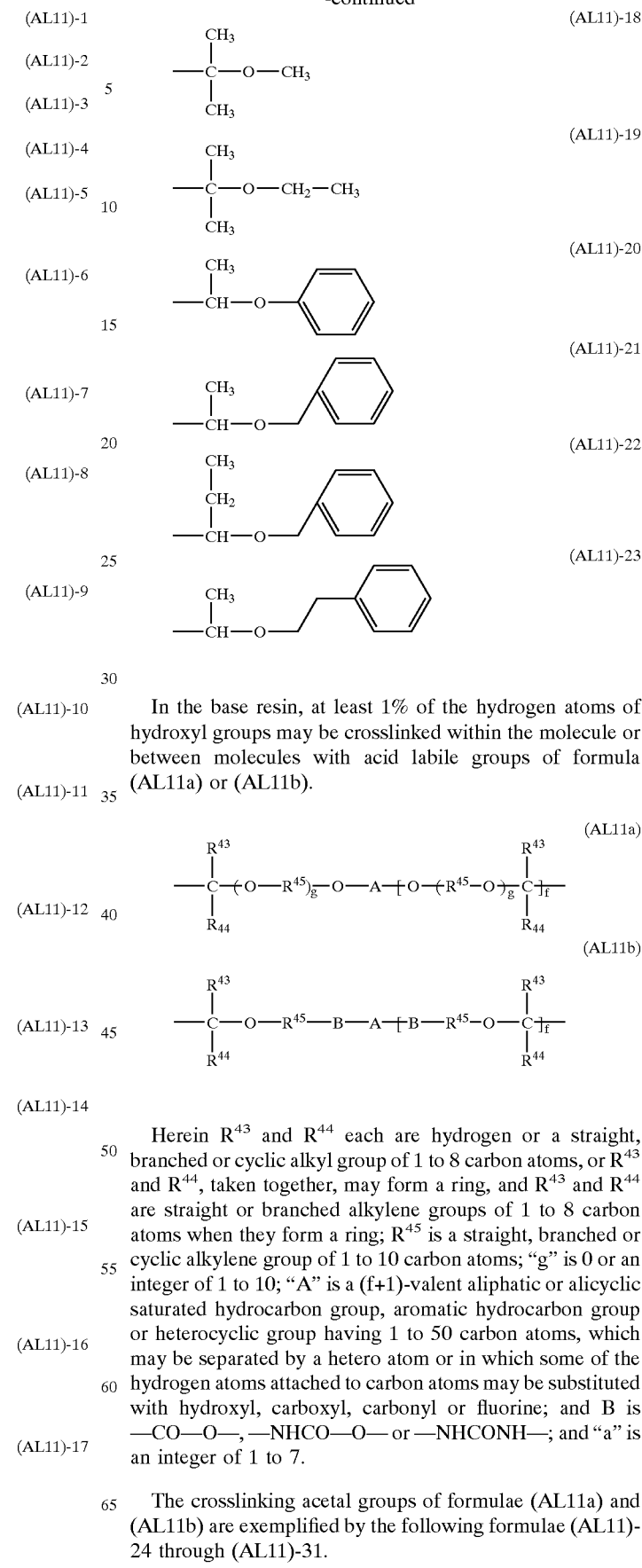

In the base resin, at least 1% of the hydrogen atoms of hydroxyl groups may be crosslinked within the molecule or between molecules with acid labile groups of formula (AL11a) or (AL11b).

Herein $R^{43}$ and $R^{44}$ each are hydrogen or a straight, branched or cyclic alkyl group of 1 to 8 carbon atoms, or $R^{43}$ and $R^{44}$, taken together, may form a ring, and $R^{43}$ and $R^{44}$ are straight or branched alkylene groups of 1 to 8 carbon atoms when they form a ring; $R^{45}$ is a straight, branched or cyclic alkylene group of 1 to 10 carbon atoms; "g" is 0 or an integer of 1 to 10; "A" is a (f+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—; and "a" is an integer of 1 to 7.

The crosslinking acetal groups of formulae (AL11a) and (AL11b) are exemplified by the following formulae (AL11)-24 through (AL11)-31.

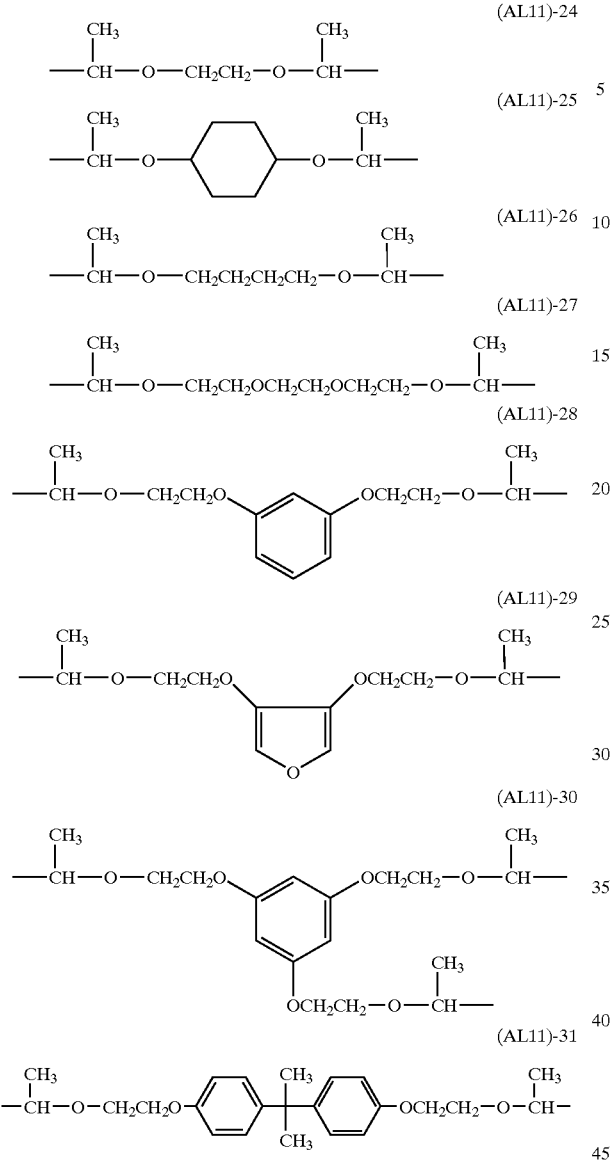
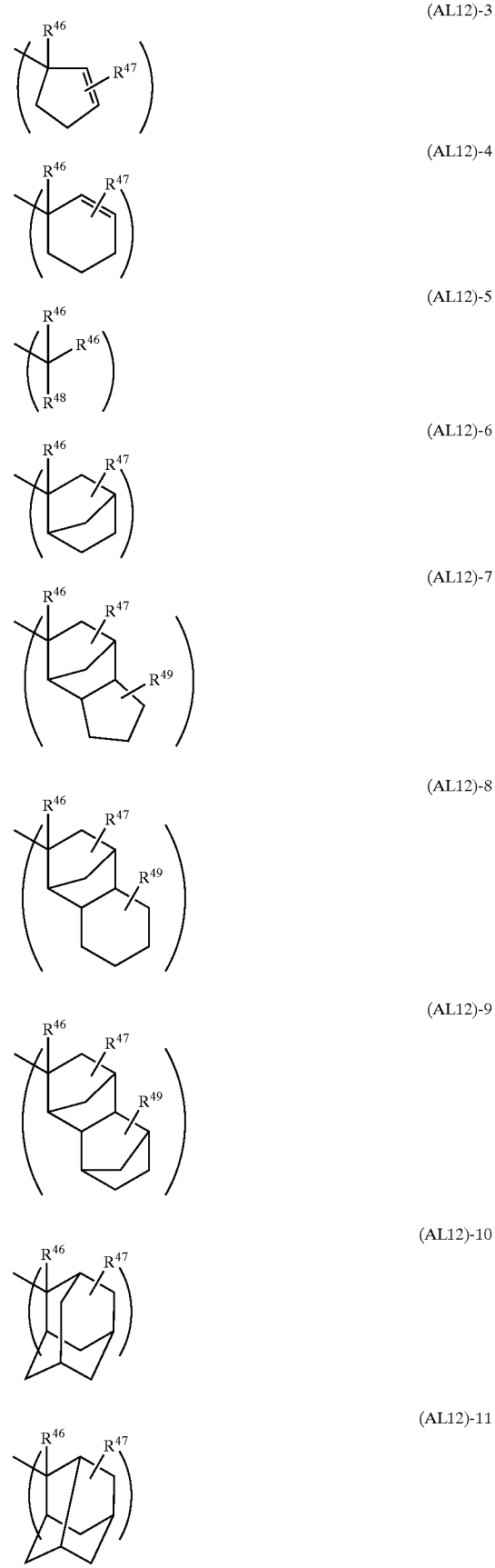
Illustrative examples of the tertiary alkyl of formula (AL12) include tert-butyl, triethylcarbyl, 1-ethylnorbornyl, 1-methylcyclohexyl, 1-ethylcyclopentyl, 2-(2-methyl)-adamantyl, 2-(2-ethyl)adamantyl, and tert-amyl groups as well as those of (AL12)-1 to (AL12)-18.
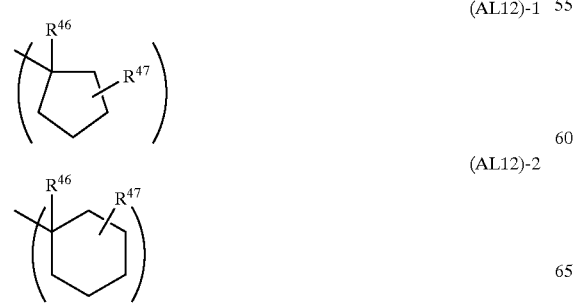

(AL12)-12
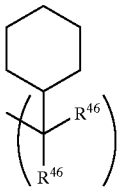

(AL12)-13
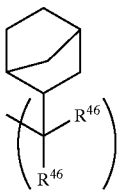

(AL12)-14
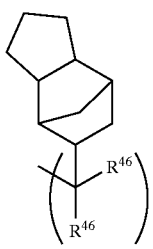

(AL12)-15
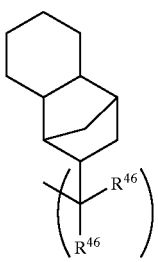

(AL12)-16
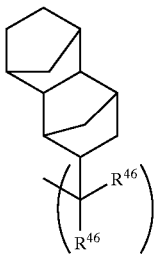

(AL12)-17
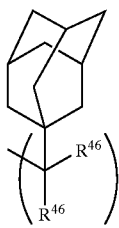

(AL12)-18
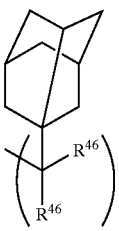

Herein $R^{46}$ is independently a straight, branched or cyclic alkyl group of 1 to 8 carbon atoms, an aryl group of 6 to 20 carbon atoms or an aralkyl group; $R^{47}$ and $R^{49}$ each are a single bond or a straight, branched or cyclic alkyl group of 1 to 20 carbon atoms; and $R^{48}$ is an aryl group of 6 to 20 carbon atoms or aralkyl group.

With $R^{50}$ representative of a di- or more valent alkylene or arylene group included as shown in formulae (AL12)-19 and (AL12)-20, the polymer may be crosslinked within the molecule or between molecules. In formulae (AL12)-19 and (AL12)-20, $R^{46}$ is as defined above; $R^{50}$ is a straight, branched or cyclic alkylene group of 1 to 20 carbon atoms or arylene group which may contain a heteroatom such as oxygen, sulfur or nitrogen; and h is an integer of 1 to 3.

(AL12)-19
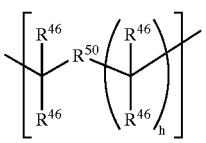

(AL12)-20
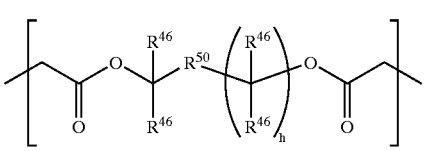

The alkyl groups represented by $R^{46}$, $R^{47}$, $R^{48}$ and $R^{49}$ may contain a heteroatom such as oxygen, nitrogen or sulfur, examples of which are illustrated by those of the following formulae (13)-1 to (13)-7.

(13)-1

(13)-2
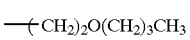

(13)-3
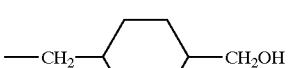

(13)-4
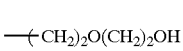

(13)-5

(13)-6
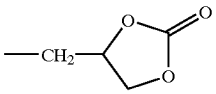

(13)-7
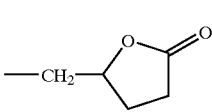

Exemplary of the trialkylsilyl group whose alkyl moiety each has 1 to 6 carbon atoms are trimethylsilyl, triethylsilyl and dimethyl-tert-butylsilyl. Exemplary of the $C_{4-20}$ oxoalkyl group are 3-oxocyclohexyl, 5-methyl-2-oxooxolan-5-yl and 2-oxooxolan-4-yl.

Formulae (a-1), (b-1), (c-1) and (d-1) are fluorine-containing groups for improving transparency, while additional recurring units containing adhesive groups are preferably incorporated in order to enhance the adhesion of the polymer to the substrate.

The adhesive groups may be selected from a variety of such groups, typically acrylates having a hydrophilic group at the ester site as shown by formula (4)-1 below,

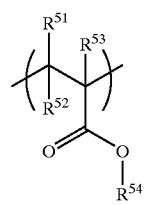

(4)-1

Herein $R^{51}$ and $R^{52}$ are hydrogen or fluorine, $R^{53}$ is hydrogen, fluorine, methyl or trifluoromethyl, and $R^{54}$ is a substituent group as exemplified below.

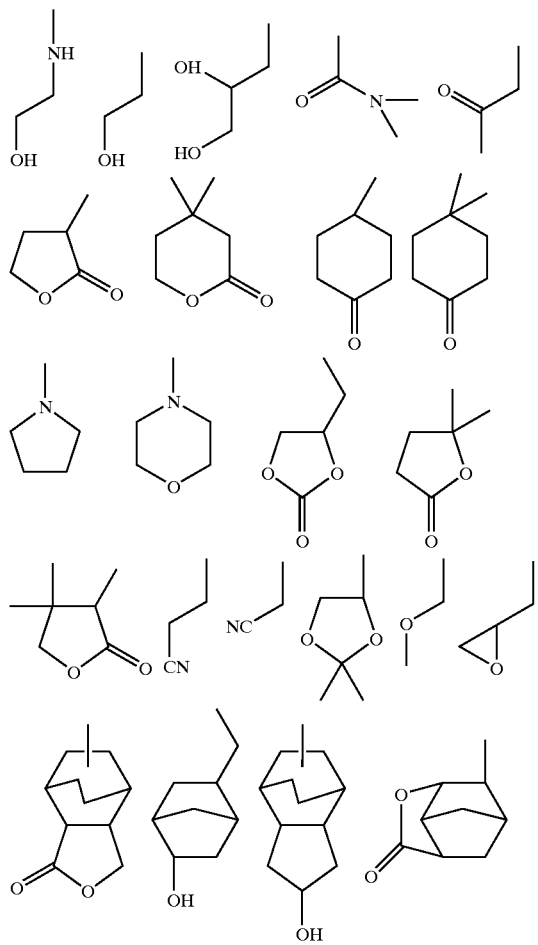

-continued

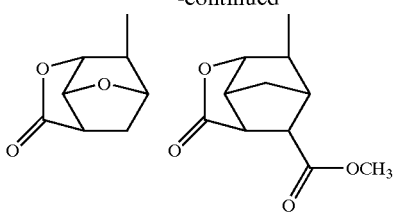

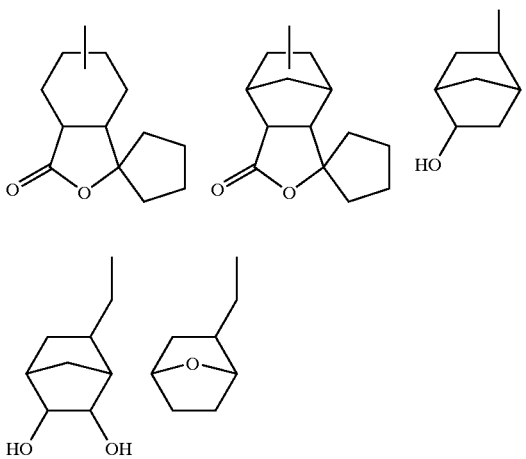

Also, recurring units of styrene having a hexafluoroalcohol pendant as shown below may be included as the adhesive group.

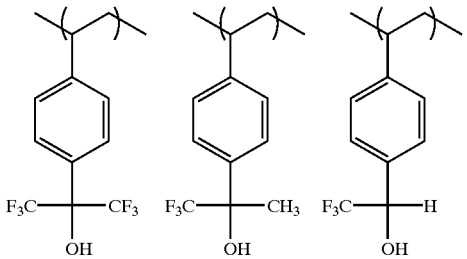

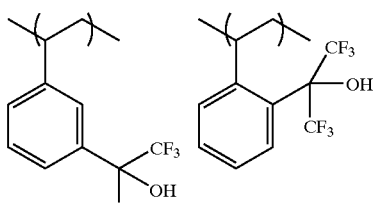

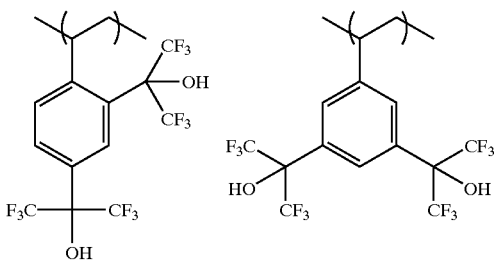

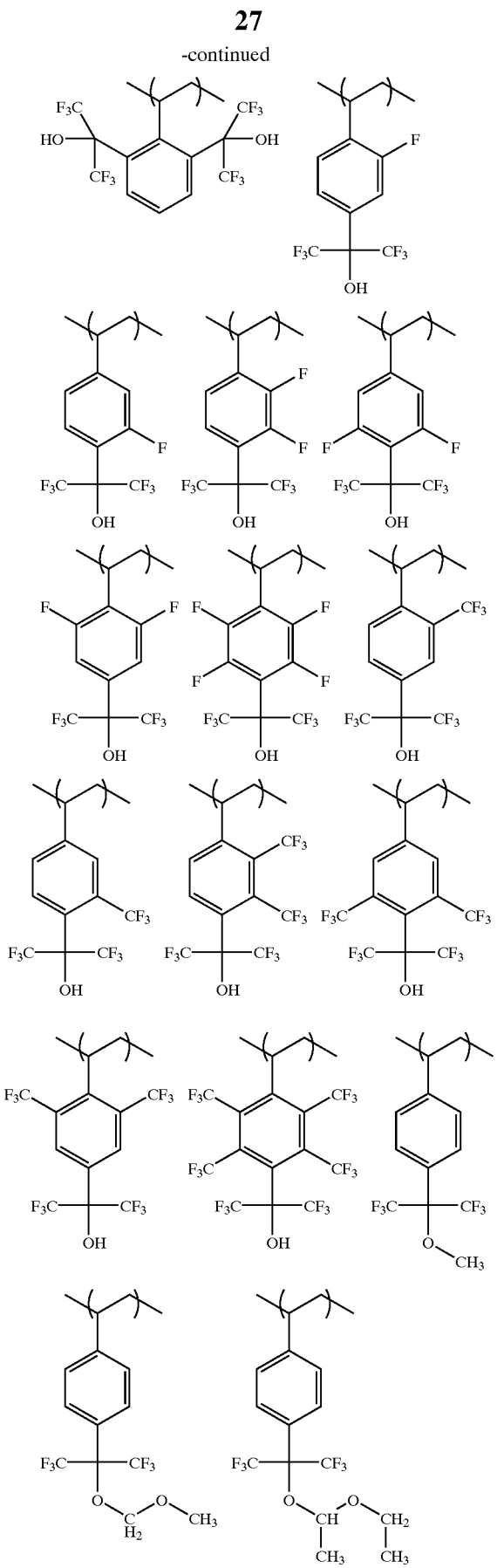
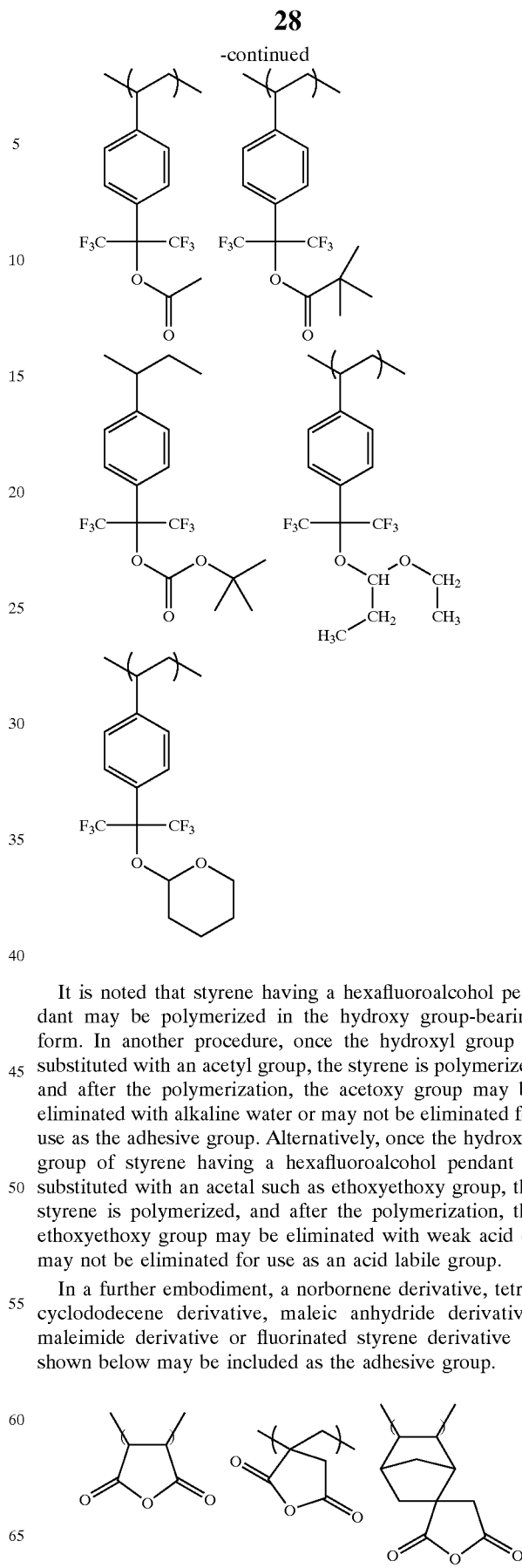

It is noted that styrene having a hexafluoroalcohol pendant may be polymerized in the hydroxy group-bearing form. In another procedure, once the hydroxyl group is substituted with an acetyl group, the styrene is polymerized and after the polymerization, the acetoxy group may be eliminated with alkaline water or may not be eliminated for use as the adhesive group. Alternatively, once the hydroxyl group of styrene having a hexafluoroalcohol pendant is substituted with an acetal such as ethoxyethoxy group, the styrene is polymerized, and after the polymerization, the ethoxyethoxy group may be eliminated with weak acid or may not be eliminated for use as an acid labile group.

In a further embodiment, a norbornene derivative, tetracyclododecene derivative, maleic anhydride derivative, maleimide derivative or fluorinated styrene derivative as shown below may be included as the adhesive group.

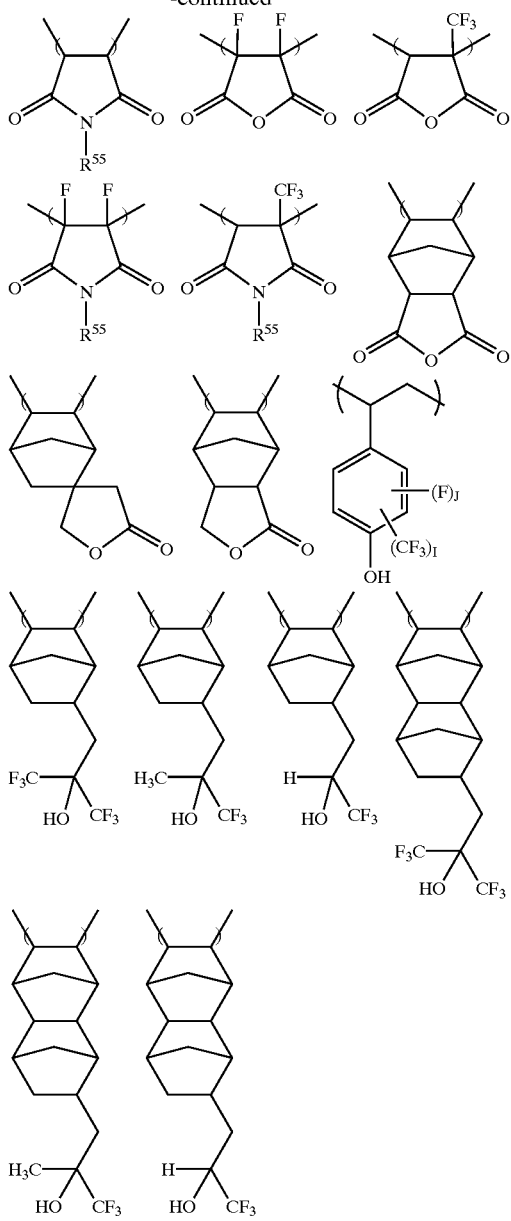

Herein $R^{55}$ is hydrogen, hydroxyl or a straight, branched or cyclic alkyl group of 1 to 10 carbon atoms, j is a number of 0 to 4, and i is a number of 0 to 4.

The polymer is generally synthesized by dissolving a fluorinated monomer or monomers corresponding to the respective units of formulae (a-1), (b-1), (c-1) and (d-1) and optionally, an acid labile group-containing monomer or monomers of formula (3-1) to (3-8) and an adhesion-improving monomer as mentioned above in a solvent, adding a catalyst thereto, and effecting polymerization reaction while heating or cooling the system if necessary. The polymerization reaction depends on the type of initiator or catalyst, trigger means (including light, heat, radiation and plasma), and polymerization conditions (including temperature, pressure, concentration, solvent, and additives). Commonly used for preparation of the polymer are radical polymerization of triggering polymerization with radicals of 2,2'-azobisisobutyronitrile (AIBN) or the like, and ion (anion) polymerization using catalysts such as alkyl lithium. These polymerization steps may be carried out in their conventional manner.

The radical polymerization initiator used herein is not critical. Exemplary initiators include azo compounds such as 2,2'-azobis(4-methoxy-2,4-dimethylvaleronitrile), 2,2'-azobis(2,4-dimethylvaleronitrile), 2,2'-azobisisobutyronitrile, and 2,2'-azobis(2,4,4-trimethylpentane); and peroxide compounds such as tert-butyl peroxypivalate, lauroyl peroxide, benzoyl peroxide and tert-butyl peroxylaurate. Water-soluble initiators include persulfate salts such as potassium persulfate, and redox combinations of potassium persulfate or peroxides such as hydrogen peroxide with reducing agents such as sodium sulfite. The amount of the polymerization initiator used is determined as appropriate in accordance with such factors as the identity of initiator and polymerization conditions, although the amount is often in the range of about 0.001 to 5% by weight, especially about 0.01 to 2% by weight based on the total weight of monomers to be polymerized.

For the polymerization reaction, a solvent may be used. The polymerization solvent used herein is preferably one which does not interfere with the polymerization reaction. Typical solvents include ester solvents such as ethyl acetate and n-butyl acetate, ketone solvents such as acetone, methyl ethyl ketone and methyl isobutyl ketone, aliphatic or aromatic hydrocarbon solvents such as toluene, xylene and cyclohexane, alcohol solvents such as isopropyl alcohol and ethylene glycol monomethyl ether, and ether solvents such as diethyl ether, dioxane, and tetrahydrofuran. These solvents may be used alone or in admixture of two or more. Further, any of well-known molecular weight modifiers such as dodecylmercaptan may be used in the polymerization system.

The temperature of polymerization reaction varies in accordance with the identity of polymerization initiator and the boiling point of the solvent although it is often preferably in the range of about 20 to 200° C., and especially about 50 to 140° C. Any desired reactor or vessel may be used for the polymerization reaction.

From the solution or dispersion of the polymer thus obtained, the organic solvent or water serving as the reaction medium is removed by any of well-known techniques. Suitable techniques include, for example, re-precipitation followed by filtration, and heat distillation under partial vacuum.

Desirably the polymer has a weight average molecular weight of about 1,000 to about 1,000,000, and especially about 2,000 to about 100,000.

In the polymer comprising fluorinated recurring units of formulae (a-1), (b-1) and (d-1), their content is preferably in the range of 0.05 to 0.7, more preferably 0.1 to 0.6, provided that the total of entire recurring units is 1. The content of acid labile group-containing recurring units (c-1) or (3-1) to (3-8) is preferably in the range of 0.1 to 0.8, more preferably 0.15 to 0.75.

The resist composition of the invention can be used as a chemical amplification type resist composition, and especially chemical amplification type positive working resist composition. It is understood that the polymer may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Component (C)

The organic solvent used as component (C) in the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol-1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyl-tetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

Component (D)

Suitable examples of the photoacid generator (D) include onium salts of formula (5) below, diazomethane derivatives of formula (6), glyoxime derivatives of formula (7), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (5).

$(R^{100})_q M^+ K^-$ (5)

In the formula, $R^{100}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter q is 2 or 3.

Illustrative examples of alkyl groups represented by $R^{100}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Illustrative examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

The diazomethane derivatives used as the photoacid generator are of the general formula (6).

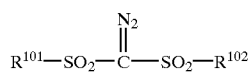

(6)

In the formula, $R^{101}$ and $R^{102}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{101}$ and $R^{102}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

Examples of the diazomethane derivatives include bis (benzenesulfonyl)diazomethane, bis(p-toluenesulfonyl) diazomethane, bis(xylenesulfonyl)diazomethane, bis (cyclohexylsulfonyl)diazomethane, bis (cyclopentylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, bis (tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl) diazomethane, 1-cyclohexylsulfonyl-1-(tert-butylsulfonyl) diazomethane, 1-cyclohexylsulfonyl-1-(tert-amylsulfonyl) diazomethane, and 1-tert-amylsulfonyl-1-(tert-butylsulfonyl)diazomethane.

The glyoxime derivatives used as the photoacid generator are of the general formula (7).

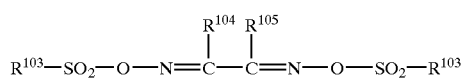

(7)

In the formula, $R^{103}$ to $R^{105}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{104}$ and $R^{105}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{103}$ to $R^{105}$ are exemplified by the same groups as mentioned above for $R^{101}$ and $R^{102}$. Examples of alkylene groups represented by $R^{104}$ and $R^{105}$ include methylene, ethylene, propylene, butylene, and hexylene.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Other useful photoacid generators include β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris (trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin (A). At less than 0.2 part, the amount of acid generated during exposure would be too small and the sensitivity and resolution be poor, whereas the addition of more than 15 parts would lower transparency and result in a poor resolution.

Component (E)

The basic compound used as component (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene. Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_m(Y)_{3-m} \tag{B-1}$$

In the formula, m is equal to 1, 2 or 3; the side chain Y is independently hydrogen or a straight, branched or cyclic alkyl group of 1 to 20 carbon atoms which may contain a hydroxyl group or ether; and the side chain X is independently selected from groups of the following general formulas (X)-1 to (X)-3, and two or three X's may bond together to form a ring.

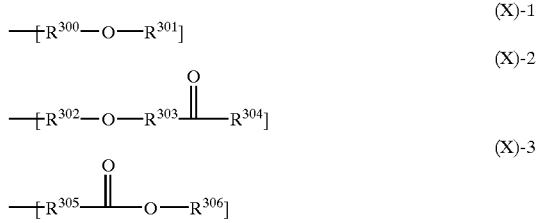

In the formulas, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

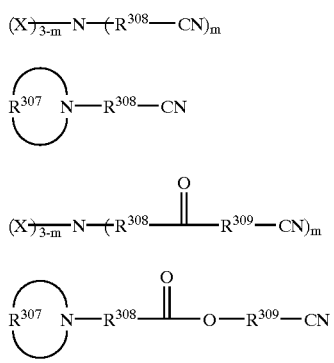

(B)-3
(B)-4
(B)-5
(B)-6

Herein, X, $R^{307}$ and m are as defined above, and $R^{308}$ and $R^{309}$ each are independently a straight or branched alkylene group of 1 to 4 carbon atoms.

Illustrative examples of the cyano-bearing basic compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 2 parts, and especially 0.01 to 1 part by weight, per 100 parts by weight of the base resin. Less than 0.001 part of the basic compound may fail to achieve is the desired effects thereof, while the use of more than 2 parts would result in too low a sensitivity.

Other Components

Well-known dissolution inhibitors may be added. A suitable dissolution inhibitor is a compound with a molecular weight of up to 3,000 which changes its solubility in an alkaline developer under the action of an acid. Typically, a compound obtained by partially or entirely substituting acid labile groups for hydroxyl groups on a phenol or carboxylic acid derivative having a molecular weight of up to 2,500 is added as the dissolution inhibitor.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile substituents are the same as described above.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))phenyl)propane, 2,2-bis(4'-(2"-tetrahydrofuranyloxy)phenyl)propane, 2,2-bis(4'-tert-butoxyphenyl)propane, 2,2-bis(4'- tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor is up to about 20 parts, and especially up to about 15 parts by weight per 100 parts by weight of the solids in the composition. With more than 20 parts of the dissolution inhibitor, the resist composition becomes less heat resistant because of an increased content of monomer components.

The resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 $\mu$m, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF excimer laser (193 nm), $F_2$ laser (157 nm), $Kr_2$ excimer laser (146 nm), KrAr excimer laser (134 nm) or $Ar_2$ laser (126 nm), x-rays, or an electron beam. The desired pattern may not be obtainable outside the upper and lower limits of the above range.

The resist composition according to the invention is sensitive to high-energy radiation, and has excellent sensitivity and transparency at a wavelength of up to 200 nm, especially up to 170 nm, significantly improved wettability to alkaline developer and T-top profile prevention as well as satisfactory plasma etching resistance. These features of the inventive resist composition enable its use particularly as a resist having a low absorption at the exposure wavelength of a $F_2$ laser, and permit a finely defined pattern having sidewalls perpendicular to the substrate to be easily be formed, making the resist ideal as a micropatterning material in VLSI fabrication.

EXAMPLE

Examples of the invention are given below by way of illustration and not by way of limitation.

Examples and Comparative Examples
Additive Transmittance Measurement

A dissolution accelerator DRA-2, 0.1 g, and 0.9 g of Polymer 5 were thoroughly dissolved in 20 g of propylene glycol monomethylether acetate (PGMEA) and passed through a 0.2-$\mu$m filter, obtaining a DRA-added polymer solution.

Separately, 1 g of Polymer 5 was thoroughly dissolved in 20 g of PGMEA and passed through a 0.2-$\mu$m filter, obtaining a polymer solution.

The polymer solution was spin coated onto a $MgF_2$ substrate and baked on a hot plate at 100° C. for 90 seconds, forming a polymer film of 250 nm thick on the substrate. Using a vacuum ultraviolet spectrometer (VUV-200S by Nihon Bunko K.K.), the polymer film was measured for transmittance. The transmittance of the DRA-added polymer was converted into an absorbance, from which the absorbance of the polymer film was subtracted to determine the absorbance of DRA-2, which was converted to a transmittance. The measurement results are shown in FIG. 1.

Resist Preparation and Exposure

Resist solutions were prepared in a conventional manner by formulating the polymer and other components in the amounts shown in Tables 1 and 2.

On silicon wafers having a film of AR-19 (Shipley) coated to a thickness of 82 nm, the resist solutions were spin coated, then baked on a hot plate at 120° C. for 90 seconds to give resist films having a thickness of 150 nm. Next, a $MgF_2$ mask having a line-and-space Cr pattern consisting of lines whose width increased from 0.1 $\mu$m to 0.5 $\mu$m at an increment of 0.01 $\mu$m was placed in close contact with the resist surface, the resist film was exposed by means of an $F_2$ laser (VUVES-4500 Lithotec Japan Co., Ltd.) while varying the exposure dose. Immediately after the mask was removed at the end of exposure, the resist film was baked at 130° C. for 90 seconds and then developed for 60 seconds with a 2.38% aqueous solution of tetramethylammonium hydroxide. The sensitivity was defined as the optimal exposure (mJ/cm$^2$) which provided a 1:1 resolution at the top and bottom of a 0.3 μm line-and-space pattern. The resolution of the resist under evaluation was defined as the minimum line width (μm) of the lines and spaces that separated at the optimal exposure. The results are shown in Tables 1 and 2.

TABLE 1

Examples

| Polymer (pbw) | Photoacid generator (pbw) | Base (pbw) | Base (pbw) | Solvent (pbw) | Sensitivity (mJ/cm$^2$) | Resolution (μm) |
|---|---|---|---|---|---|---|
| Polymer 1 (100) | PAG1 (2) | TBA (0.1) | DRA-1 (10) | PGMEA (1000) | 8 | 0.16 |
| Polymer 2 (100) | PAG1 (2) | TBA (0.1) | DRA-2 (10) | PGMEA (1000) | 6 | 0.14 |
| Polymer 3 (100) | PAG1 (2) | TBA (0.1) | DRA-1 (10) | PGMEA (1000) | 28 | 0.18 |
| Polymer 4 (100) | PAG1 (2) | TBA (0.1) | DRA-1 (10) | PGMEA (1000) | 33 | 0.18 |
| Polymer 5 (100) | PAG1 (2) | TBA (0.1) | DRA-1 (10) | PGMEA (1000) | 27 | 0.18 |
| Polymer 6 (100) | PAG1 (2) | TBA (0.1) | DRA-1 (10) | PGMEA (1000) | 40 | 0.16 |
| Polymer 6 (100) | PAG1 (2) | TBA (0.1) | DRA-2 (10) | PGMEA (1000) | 44 | 0.18 |
| Polymer 6 (100) | PAG1 (2) | TBA (0.1) | DRA-3 (10) | PGMEA (1000) | 42 | 0.16 |
| Polymer 6 (100) | PAG1 (2) | TBA (0.1) | DRA-4 (10) | PGMEA (1000) | 44 | 0.16 |
| Polymer 6 (100) | PAG1 (2) | TBA (0.1) | DRA-5 (10) | PGMEA (1000) | 38 | 0.18 |
| Polymer 6 (100) | PAG1 (2) | TBA (0.1) | DRA-6 (10) | PGMEA (1000) | 48 | 0.18 |
| Polymer 6 (100) | PAG1 (2) | TBA (0.1) | DRA-7 (10) | PGMEA (1000) | 47 | 0.18 |
| Polymer 6 (100) | PAG1 (2) | TBA (0.1) | DRA-8 (10) | PGMEA (1000) | 48 | 0.18 |
| Polymer 6 (100) | PAG1 (2) | TBA (0.1) | DRA-9 (10) | PGMEA (1000) | 44 | 0.18 |
| Polymer 6 (100) | PAG1 (2) | TBA (0.1) | DRA-10 (10) | PGMEA (1000) | 44 | 0.20 |
| Polymer 6 (100) | PAG1 (2) | TBA (0.1) | DRA-11 (10) | PGMEA (1000) | 44 | 0.16 |
| Polymer 6 (100) | PAG1 (2) | TBA (0.1) | DRA-12 (10) | PGMEA (1000) | 41 | 0.16 |
| Polymer 6 (100) | PAG1 (2) | TBA (0.1) | DRA-13 (10) | PGMEA (1000) | 38 | 0.17 |
| Polymer 6 (100) | PAG1 (2) | TBA (0.1) | DRA-14 (10) | PGMEA (1000) | 36 | 0.17 |
| Polymer 6 (100) | PAG1 (2) | TBA (0.1) | DRA-15 (10) | PGMEA (1000) | 40 | 0.16 |
| Polymer 6 (100) | PAG1 (2) | TBA (0.1) | DRA-16 (10) | PGMEA (1000) | 36 | 0.16 |
| Polymer 6 (100) | PAG1 (2) | TBA (0.1) | DRA-17 (10) | PGMEA (1000) | 34 | 0.16 |
| Polymer 6 (100) | PAG1 (2) | TBA (0.1) | DRA-1 (20) | PGMEA (1000) | 25 | 0.16 |
| Polymer 6 (100) | PAG2 (2) | TBA (0.1) | DRA-1 (10) | PGMEA (1000) | 37 | 0.16 |
| Polymer 6 (100) | PAG1 (2) | TBA (0.1) | DRA-1 (10) | PGMEA (1000) | 39 | 0.16 |
| Polymer 6 (100) | PAG1 (2) | TMMEA (0.1) | DRA-1 (10) | PGMEA (1000) | 33 | 0.15 |
| Polymer 6 (100) | PAG1 (2) | AAA (0.1) | DRA-1 (10) | PGMEA (1000) | 39 | 0.15 |
| Polymer 6 (100) | PAG1 (2) | AACN (0.1) | DRA-1 (10) | PGMEA (1000) | 43 | 0.15 |
| Polymer 6 (100) | PAG1 (2) | TBA (0.1) | DRA-1 (10) DRI-1 (10) | PGMEA (1000) | 33 | 0.16 |

TABLE 2

Comparative Examples

| Polymer (pbw) | Photoacid generator (pbw) | Base (pbw) | Base (pbw) | Solvent (pbw) | Sensitivity (mJ/cm$^2$) | Resolution ($\mu$m) |
|---|---|---|---|---|---|---|
| Polymer 1 (100) | PAG1 (2) | TBA (0.1) | — | PGMEA (1000) | 15 | 0.2 |
| Polymer 2 (100) | PAG1 (2) | TBA (0.1) | — | PGMEA (1000) | 14 | 0.2 |
| Polymer 3 (100) | PAG1 (2) | TBA (0.1) | — | PGMEA (1000) | 44 | 0.28 |
| Polymer 4 (100) | PAG1 (2) | TBA (0.1) | — | PGMEA (1000) | 50 | 0.30 |
| Polymer 5 (100) | PAG1 (2) | TBA (0.1) | — | PGMEA (1000) | 45 | 0.28 |
| Polymer 6 (100) | PAG1 (2) | TBA (0.1) | — | PGMEA (1000) | 55 | 0.26 |
| Polymer 6 (100) | PAG1 (2) | TBA (0.1) | DRA-18 (10) | PGMEA (1000) | 45 | 0.22 |
| Polymer 6 (100) | PAG1 (2) | TBA (0.1) | DRA-19 (10) | PGMEA (1000) | 43 | 0.21 |
| Polymer 6 (100) | PAG1 (2) | TBA (0.1) | DRA-20 (10) | PGMEA (1000) | 48 | 0.22 |

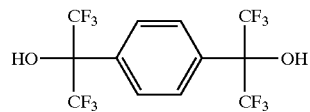

DRA-1

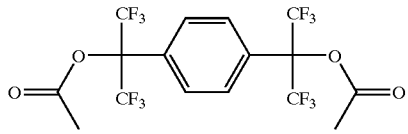

DRA-6

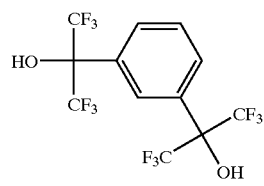

DRA-2

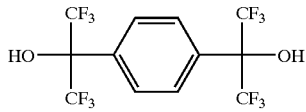

DRA-7

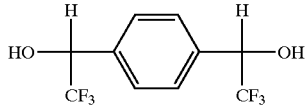

DRA-8

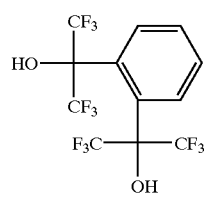

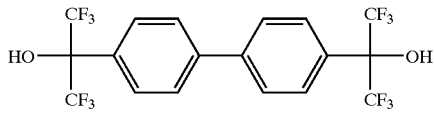

DRA-9

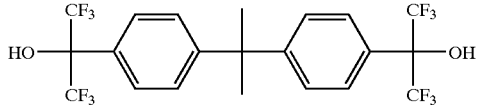

DRA-10

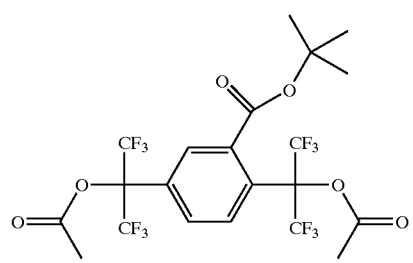

DRA-4

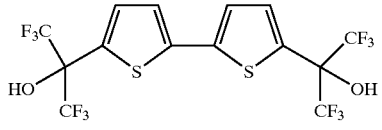

DRA-11

DRA-5

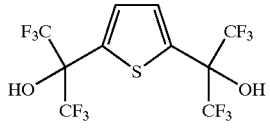

DRA-12

-continued
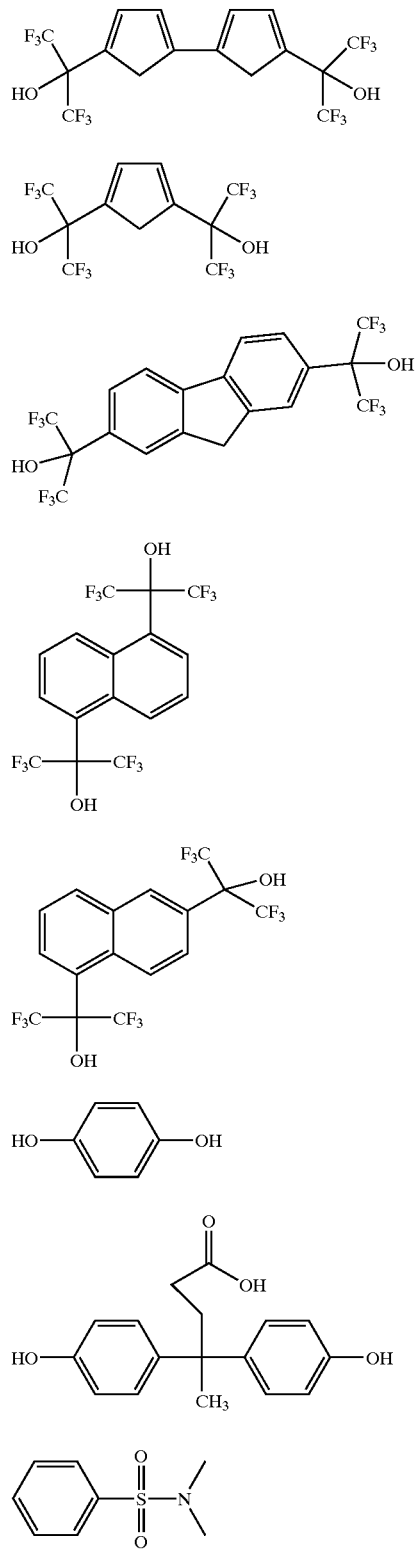
TBA: tributylamine
TEA: triethanolamine
PGMEA: propylene glycol monomethyl ether acetate
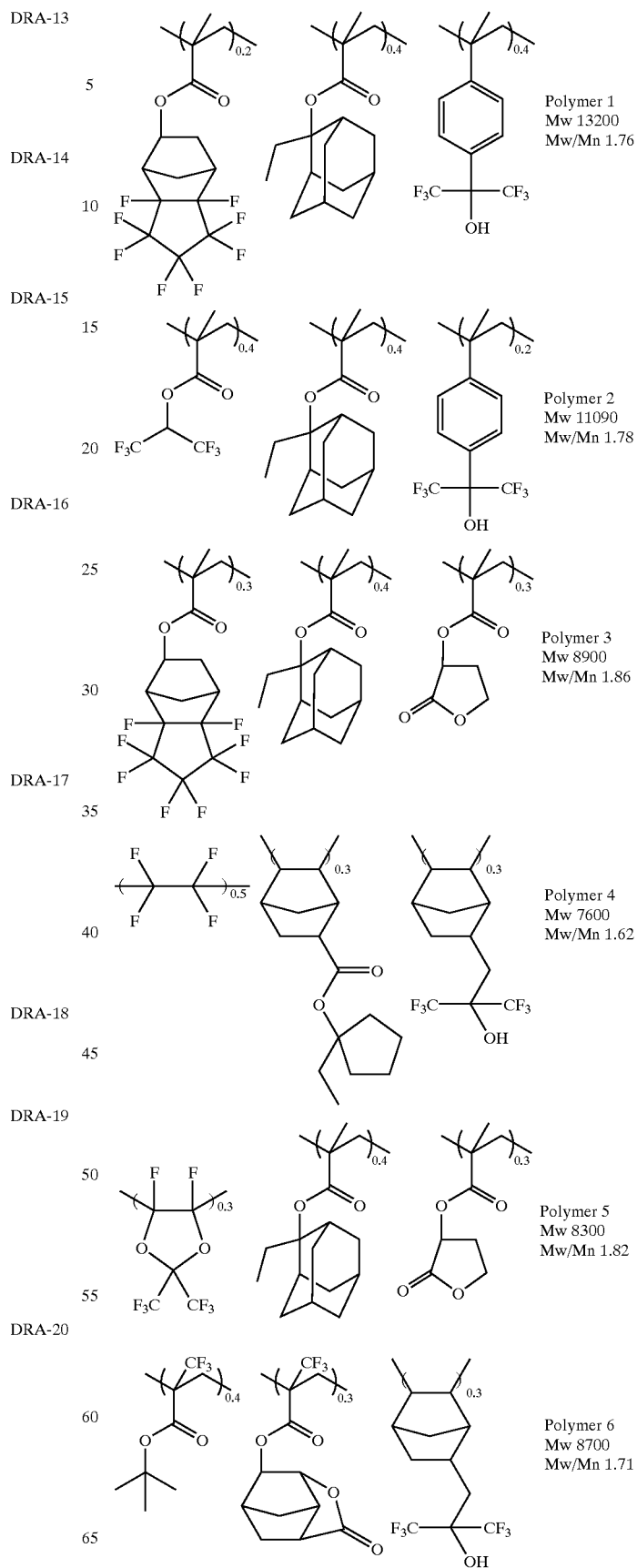

-continued

PAG1
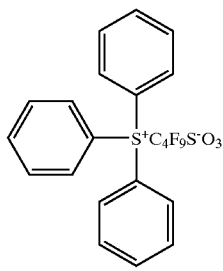

PAG2
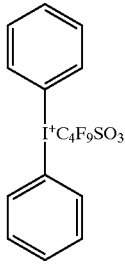

TMMEA
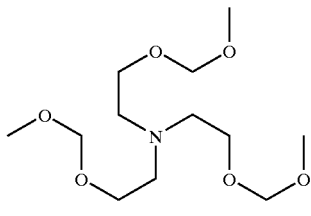

AAA
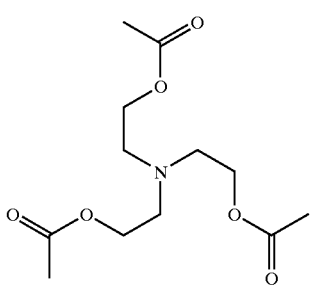

AACN
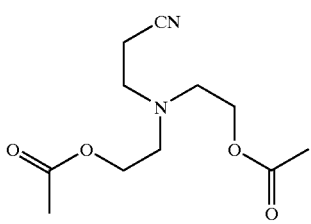

As is evident from FIG. 1, the dissolution accelerators according to the invention have little absorption near 157 nm. The data of Examples shown in Table 1 and Comparative Examples shown in Table 2 reveal that the addition of compounds of formula (1) contributes to improved resolution and sensitivity.

Japanese Patent Application No. 2001-296871 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A chemically amplified resist composition comprising (A) a polymer comprising recurring units containing at least one fluorine atom, (B) a compound of the following general formula (1):

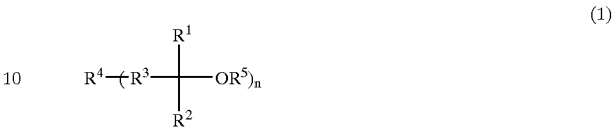

(1)

wherein $R^1$ and $R^2$ are independently hydrogen, fluorine or alkyl or fluorinated alkyl having 1 to 4 carbon atoms, at least either one of $R^1$ and $R^2$ contains at least one fluorine atom, $R^3$ is a single bond or alkylene of 1 to 4 carbon atoms, $R^4$ is a n-valent aromatic group or cyclic diene group having 4 to 40 carbon atoms, $R^5$ is hydrogen or $C(=O)R^6$, $R^6$ is hydrogen or methyl, and n is 2, 3 or 4, (C) an organic solvent, and (D) a photoacid generator.

2. The chemically amplified resist composition of claim 1 wherein the polymer (A) has recurring units of at least one of the following general formulae (a-1), (b-1), (c-1) and (d-1):

(a-1)

(b-1)

(c-1)

(d-1)

wherein $R^7$, $R^8$, $R^9$ and $R^{10}$ each are hydrogen, fluorine or trifluoromethyl, at least one of $R^7$ to $R^{10}$ contains fluorine, $R^{11}$ is hydrogen, methyl or trifluoromethyl, $R^{12}$ is a straight, branched or cyclic alkyl group of 1 to 20 carbon atoms containing at least one fluorine atom, $R^{13}$ is trifluoromethyl, $R^{14}$ is an acid labile group, $R^{15}$ and $R^{16}$ each are hydrogen or fluorine, $R^{17}$ and $R^{18}$ each are methyl or trifluoromethyl, at least one of $R^{15}$ to $R^{18}$ contains fluorine.

3. The chemically amplified resist composition of claim 1 further comprising (E) a basic compound.

4. A process for forming a resist pattern comprising the steps of:

applying the resist composition of claim 1 onto a substrate to form a coating, heat treating the coating and then exposing it to high-energy radiation in a wavelength band of 100 to 180 nm through a photo mask, and optionally heat treating the exposed coating and developing it with a developer.

5. The pattern forming process of claim 4 wherein the high-energy radiation is an $F_2$ laser beam or $Ar_2$ laser beam.

* * * * *